United States Patent [19]

Nakamura et al.

[11] Patent Number: 5,324,959
[45] Date of Patent: Jun. 28, 1994

[54] SEMICONDUCTOR OPTICAL DEVICE HAVING A HETEROINTERFACE THEREIN

[75] Inventors: Hitoshi Nakamura, Kanagawa; Shoichi Hanatani, Kodaira; Chiaki Notsu; Tsukuru Ohtoshi, both of Kokubunji; Koji Ishida, Musashino, all of Japan

[73] Assignees: Hitachi, Ltd., Tokyo; Hitachi Device Engineering Co., Ltd., Mobara, both of Japan

[21] Appl. No.: 883,933

[22] Filed: May 14, 1992

Related U.S. Application Data

[63] Continuation of Ser. No. 621,247, Nov. 30, 1990.

[30] Foreign Application Priority Data

Dec. 8, 1989 [JP] Japan ................. 1-317519

[51] Int. Cl.⁵ ............... H01L 29/205; H01L 31/06
[52] U.S. Cl. ......................... 257/17; 257/21; 257/22; 257/186
[58] Field of Search ............ 357/4, 16, 22, 30; 257/17, 22, 21, 186

[56] References Cited

U.S. PATENT DOCUMENTS 4,181,901 1/1980 Heyke .............. 250/211 J
5,061,970 10/1991 Goronkin .............. 257/22

FOREIGN PATENT DOCUMENTS 61-224468 10/1986 Japan .................. 357/4

OTHER PUBLICATIONS

*Appl. Phys. Lett.* 54(1) 2 Jan. 1989 Wada et al "Very High Speed GaInAs . . . Superlattice".
Capasso et al *Appl. Phys. Lett.* 45(11) 1 Dec. 84 pp. 1193-1195 "Pseudo-quaternary . . . Photodiodes".

Primary Examiner—Jerome Jackson
Attorney, Agent, or Firm—Kenyon & Kenyon

[57] ABSTRACT

A semiconductor device includes a region in which carriers are transferred in the lamination direction of a multiple quantum well, such as a multiple quantum well multiplication layer of a superlattice APD. A superlattice structure with a varying well width is introduced to a hetero-interface present in the transfer region, thereby preventing pile-up of the carriers.

12 Claims, 3 Drawing Sheets

SEMICONDUCTOR OPTICAL DEVICE HAVING A HETEROINTERFACE THEREIN

This application is a continuation of application Ser. No. 07/621,247, filed on Nov. 30, 1990.

BACKGROUND OF THE INVENTION

1. Field of the Invention

This invention relates to a semiconductor device, more particularly to a semiconductor device which is especially preferable when applied to a semiconductor device having a hetero-interface therein, such as light receiving elements, e.g., avalanche photodiode (APD) or PIN photodiode, and optical modulators.

2. Description of the Related Art

The APDs, which per se have a multiplication function, are widely used in the field of optical communication because of their wide bandwidth and high gain. In consideration of application of the APDs to high-speed optical communication systems with modulation speeds on the order of 10 Gb/s, however, there is a technical problem to be solved. That is, it is required to overcome the so-called pile-up phenomenon in which the transfer of photo-carriers is impeded at a hetero-interface in a high field application region. As countermeasures against the pile-up, there have been proposed: (1) a method in which a material having a band-discontinuity value between those of two materials constituting the hetero-interface is introduced to the hetero-interface (J. C. Cambell et. al. 'InP/InGaAsP/InGaAs avalanche photo diodes with 70 GHz gain band product' Appl. Phys. Lett. 51, 1454 (1987)); (2) a method n which a pseudo-mixed crystal using a thin film is introduced to the hetero-interface (F. Capasso et. al. 'Pseudo-quaternary GaInAsP semiconductors: A new GaInAs/InP graded gap superlattice and its applications to avalanche photo diodes' Appl.Phys. Lett. 45(11) p1193 (1984)); and (3) a method in which a semiconductor laminate transition region having an extra thin film barrier layer is provided (Japanese Patent Application Laid-Open (KOKAI) No. 61-224468 (1986)).

The above-mentioned techniques are intended to cope with the pile-up at the hetero-interface in APD or PIN photodiodes, represented by light receiving elements. However, the pile-up phenomenon also considered to cause hindrance of high-speed operations, in many other semiconductor devices such as optical modulators.

SUMMARY OF THE INVENTION

None of the three techniques according to the prior art can satisfactorily prevent the pile-up. For instance, it is difficult to achieve high-speed operations on the order of 10 GHz, even with these techniques. This is because these techniques employ a structure in which an absorption layer and a multiplication layer are separate from each other, with a bulk semiconductor being used for the multiplication layer. Especially in the method of (1) above, the problem of band-discontinuity at the hetero-interface is left essentially unsolved. In the method of (2) on the other hand, it is necessary to use a barrier layer with a large film thickness at part of the structure, leading to an increase in the time required for the carriers to pass through the pseudo-mixed crystal.

In view of the above, it may be contemplated to employ a so-called superlattice APD, in which the band-continuity at a hetero-interface is utilized for enhancing the ionization rate ratio. With the superlattice APD, however, it is yet impossible on a practical basis to accomplish a high-speed operation on the order of 10 GHz or above. This is probably because the hetero-interface present in a superlattice multiplication layer causes pile-up. Therefore, it is required to introduce a novel structure for suppressing the pile-up phenomenon, even in the multiplication region of the so-called superlattice APD.

In order to solve the technical problems involved in the prior art mentioned above and, further, to attain other objects, this invention is characterized as follows.

According to an aspect of this invention, there is provided a semiconductor device which comprises a multiple quantum well structure, the multiple quantum well structure comprising a first semiconductor region and a second semiconductor region. The first semiconductor region has a first energy bandgap and the second semiconductor region has a second energy bandgap greater than the first energy bandgap. The device also includes a means for transfer of carriers from the first semiconductor region into the second semiconductor region. A third semiconductor region has a superlattice structure disposed between the first and second semiconductor regions, the superlattice structure comprising a plurality of semiconductors having different energy bandgaps. The superlattice structure forms a miniband so as to couple the energy levels of the first and second semiconductor regions. The "superlattice structure" referred to herein is not a superlattice which constitutes, for instance, the multiple quantum well multiplication layer in a superlattice APD. The "superlattice structure" used herein means an extra thin film superlattice structure which is introduced into, for example, a multiple quantum well structure multiplication layer, and the details of which will be made clear hereinbelow. Therefore, when the invention is applied to the superlattice APD, the above-mentioned first and second semiconductor regions correspond to a narrow bandgap layer and a wide bandgap layer which constitute the superlattice multiplication layer.

The relationship between the energy bandgaps of the first and second semiconductor regions is not limited to that mentioned above. Assuming electrons as carriers, for instance, the invention is applicable to the case where the lower edge of the conduction band of the first semiconductor is lower in energy than the lower edge of the conduction band of the second semiconductor so that an energy barrier is formed against the transfer of free electrons. Assuming holes as carriers, similarly, the invention is applicable to the case where the upper edge of valence band of the first semiconductor region is higher in energy than the upper edge of the valence band of the second semiconductor region.

Thus, according to another aspect of this invention, there is provided a semiconductor device which comprises a semiconductor laminate structure, the semiconductor laminate structure comprising a first and a second semiconductor region, the second semiconductor region forming a potential barrier against free carriers in the first semiconductor region. The device further includes means for transfer of free carriers in the semiconductor laminate structure. The semiconductor laminate structure further comprises a third semiconductor region disposed between the first and second semiconductor regions, and the third semiconductor region has a miniband for coupling the first semiconductor region with the second semiconductor region.

According to a specific aspect of this invention, there is provided a semiconductor device wherein the above-mentioned means for transfer of carriers comprises electrodes for applying an electric field to the above-mentioned first and second semiconductor regions.

According to another specific aspect of this invention, there is provided a semiconductor device wherein the above-mentioned semiconductor laminate structure comprises pluralities of the first, second and third semiconductor regions. These semiconductor regions are arranged in the order of the first, the second and the third region. In a preferred embodiment of this invention, therefore, the first semiconductor region and the second semiconductor region are joined together, forming a heterojunction. The energy difference at the heterojunction gives energy to the carriers passing therethrough, and the carriers provided with the great energy, upon entering the first semiconductor region, interact with the atoms constituting the first semiconductor region, whereby new carriers are generated with the result of an increased number of carriers.

Thus, according to a further specific aspect of this invention, there is provided a semiconductor device wherein the above-mentioned semiconductor laminate structure further comprises a heterojunction for multiplication of free carriers transferred therein.

Also, according to yet another aspect of this invention, there is provided a semiconductor device wherein the above-mentioned semiconductor laminate structure comprises pluralities of the above-mentioned first, second and third semiconductor regions, and the above-mentioned heterojunction comprises a junction between the first and second semiconductors.

According to a still further specific aspect of this invention, there is provided a semiconductor device wherein the first energy bandgap of the first semiconductor region mentioned above is made to correspond to the energy of external light, whereby the external light is absorbed by the first semiconductor region.

According to an additional specific aspect of this invention, there is provided a semiconductor device wherein the above-mentioned superlattice structure comprises a plurality of semiconductor materials constituting the above-mentioned first and second semiconductor regions. More specifically, a semiconductor device may include a semiconductor laminate structure which contains InAlAs and InGaAs semiconductor materials substantially in lattice match with InP.

According to yet a further specific aspect of this invention, there is provided an optical communication system which comprises the above-mentioned semiconductor as means for receiving light, means for generating information signal light to be received by the light receiving means, waveguide means for optical coupling of the light receiving means with the light generating means, and means for detecting an electrical signal based on the information signal light obtained by the light receiving means. It is thereby possible to realize an extremely high speed optical communication system.

Moreover, in order to solve the above-mentioned technical problems, the present inventors disclose the following constituents.

According to a further aspect of this invention, there is provided a semiconductor device comprising a potential barrier portion for hindering transfer of carriers upon the application of electric field, the semiconductor device further comprising a barrier layer with up to 4 nm film thickness in the vicinity of the potential barrier portion, and a well layer disposed between the barrier layer and the potential barrier. If the film thickness of the barrier layer is greater than 4 nm, it is difficult for the semiconductor materials to form a miniband. Therefore, in the case of semiconductor material systems based on a III-V group compound, for instance, InP, GaAs, GaSb, InGaAs, InAlAs, InAsP, InAlP, GaAlSb, InGaAsP or InAlAsP, the barrier layer may be provided to have a film thickness of not greater than 4 nm. The barrier layer may further be very thin (in an extreme case, a single atomic layer may be adopted). In that case, however, no distinct energy level is formed in the quantum well, so that the miniband does not appear. In practice, therefore, a barrier layer with a certain film thickness is required. For this reason, it is preferable that the film thickness of the barrier layer be greater than 1 nm.

According to a specific aspect of this invention, there is provided a semiconductor device wherein pluralities of the above-mentioned barrier layers and the well layers are provided alternately, and the well layers differ in film thickness. A representative value of the film thickness of the well layer is 20 nm or below. One characteristic of this invention resides in that with such variations in the film thickness of the well layers, it is possible to form a miniband at the time of operation.

Also, according to another specific aspect of this invention, there is provided a semiconductor device wherein the above-mentioned film thickness of the well layers increases with the distance from the potential barrier portion. This characteristic enables formation of a miniband bridgingly extending between the wells upon the application of an electric field, thereby ensuring smooth transfer of carriers passing therethrough. Especially in consideration of carrier transfer properties for realizing the desired high-speed response of the semiconductor device, a barrier layer with a film thickness of not more than 3 nm is required.

Furthermore, according to yet another aspect of this invention, there is provided a semiconductor device which comprises means for applying an electric field, and a semiconductor laminate structure in which carriers are transferred according to an electric field developed therein by the field applying means, the semiconductor laminate structure comprising a potential barrier against transfer of the carriers, and a superlattice structure disposed upstream of the potential barrier with respect to the transfer of the carriers. The superlattice structure has an energy level extending therethrough, whereby the potential barrier is reduced on an effective basis by the energy level of the superlattice under an electric field applied to the superlattice structure by the field applying means.

According to a still further aspect of this invention, there is provided a semiconductor device in which a potential barrier formed at a heterojunction interface present in a multiple quantum well structure is removed on an effective basis by a miniband formed by a superlattice laminate structure, and which is operated by transferring carriers so as to pass through the heterojunction interface.

According to an additional aspect of this invention, there is provided a semiconductor device which comprises a region for generating carriers through photoelectric conversion, a carrier transfer region, means for applying an electric field to the carrier transfer region to thereby transfer the carriers according to the direction of the field applied, and a miniband region for coupling the energy level of the carrier generation region and the energy level of the carrier transfer region with each other to thereby facilitate transfer of free carriers.

According to yet a further aspect of this invention, there is provided a semiconductor device which comprises a superlattice structure comprising one or more barrier regions and a well region, the superlattice structure provided in the vicinity of a potential barrier formed at a heterojunction interface in a multiple quantum well structure, the number of the barrier region(s) of the superlattice structure being in the range from one to ten, whereby transfer of carriers through the heterojunction interface is facilitated.

According to a further specific aspect of this invention, there is provided a semiconductor device wherein the film thickness of the above-mentioned barrier regions is 1 to 2 nm, and the number of the barrier regions is in the range from one to five.

An advantage of this invention resides in that the pile-up phenomenon at the hetero-interface in a semiconductor device, e.g. superlattice APD, as mentioned above can be prevented substantially perfectly and, therefore, a semiconductor device capable of extremely high response can be realized. Especially when the invention is applied to the APD, a high-speed performance of 10 GHz or more is obtainable.

Another advantage of the invention lies in that it is possible to increase the ionization rate (ratio), thereby realizing a semiconductor device with a further enhanced high-speed performance and a reduced noise.

A still further advantage of the invention resides in that it is possible to produce a semiconductor device while fulfilling easily the lattice match conditions during the crystal growth process in the production, and therefore to maintain satisfactorily the intrinsic feature of the element, such as enhanced yield (in the case of light receiving elements, particularly a reduced dark current).

Still further advantages of the present invention will apparent to those of ordinary skill in the art upon reading and understanding the following detailed description of the preferred embodiments.

BRIEF DESCRIPTION OF THE DRAWINGS

The invention may take form in various parts and arrangements of parts. The drawings are only for purposes of illustrating the preferred embodiments and are not to be construed as limiting the invention.

DETAILED DESCRIPTION

The miniband transfer according to the present invention will now be explained in detail, taking as an example an application of the miniband transfer to a superlattice APD. A detailed explanation of an application of the miniband to other semiconductor elements would be similar to the following.

Figure 1:
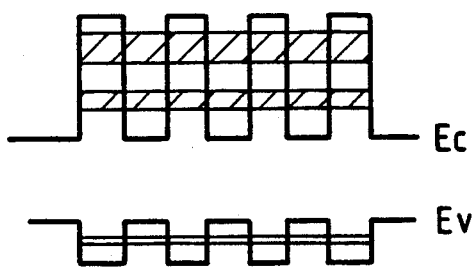
FIG. 1 is a band diagram of a miniband in a conventional superlattice.
Figure 2:
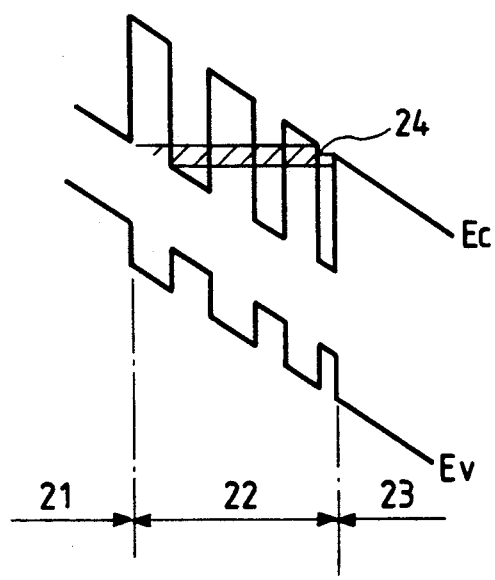
FIG. 2 is a band diagram of a miniband in a superlattice according to this invention.

A band diagram of a miniband formation is shown in FIG. 1, in which Ec and Ev represent a conduction band and a valence band, respectively. The miniband, corresponding to the hatched region in the figure, is the band-like allowed states extending throughout a superlattice comprising a periodic structure of less than about 100 Å thick well layers and barrier layers, caused by interactions between the electrons located in different wells. It is known that the transfer time of carriers in the miniband is shortened sharply when the film thickness of the barrier layers is reduced to about 30 Å. According to the present invention, a superlattice structure is introduced to a hetero-interface at which pile-up would otherwise occur, in order to prevent the pile-up by use of carrier transfer in the miniband. As has been mentioned above, in an ordinary miniband the well layers and the barrier layers in the periodic structure have substantially equal respective thicknesses. Since an APD is used in a high electric field with an operation voltage of several tens of volts, however, no miniband is formed by the above-mentioned superlattice under the operation voltage of the APD. In view of the above, this invention proposes a superlattice structure as shown in FIG. 2. In the figure, Ec and Ev represent a conduction band and a valence band, respectively, and the hatched area represents a miniband formed upon application of a voltage. The superlattice structure 22 is disposed at the hetero-interface of a narrow bandgap material 21 and a wide bandgap material 23. This invention has the typical characteristics as follows: (1) The film thickness of the barrier layers is desirably not more than 4 nm from the viewpoint of miniband formation, and is desirably not more than 3 nm in order to shorten the carrier transfer time in the miniband. (2) The film thickness of the well layers decreases monotonously, from the narrow bandgap material side toward the wide bandgap material side. (3) The number of the barrier layers is desirably large, from the viewpoint of miniband formation, but, for better high-speed performance, the number is desirably small. Taking both points into account, the number of the barrier layers should be in the range from one to ten. It is more desirable that the film thickness of the barrier layers is not more than 2 nm, and that the number of the barrier layers is one to five.

Also, it is desirable that the superlattice pile-up prevention layer 22 comprise a combination of the materials 21 and 23 which constitute the hetero-interface. With such a combination it is possible to fulfill easily the lattice match conditions in the production of the intended element, and to form the miniband easily.

The introduction of the superlattice structure having the characteristics mentioned above ensures that the quantum levels of the wells in the superlattice conform to each other in the vicinity of the miniband when the operation voltage of the APD is applied, resulting in the formation of the miniband as denoted by 24 in FIG. 2. Consequently, the carriers which would be accumulated at the hetero-interface between the materials 21 and 23 in the absence of the superlattice structure (the carriers in this case are atoms in the conduction band) are now transferred into the material 23 through the miniband in a short time. Thus, the pile-up is prevented.

This invention will now be described more in detail below with reference to some specific embodiments.

EXAMPLE 1

Figure 3:
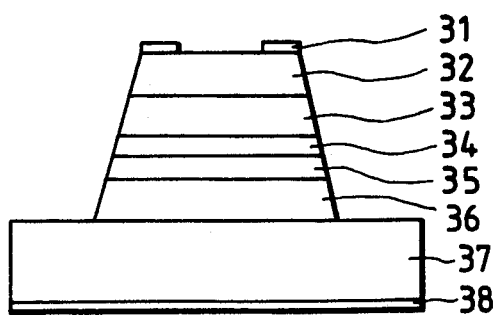
FIGS. 3 and 6 are each a sectional view of an APD according to one embodiment of this invention.
Figure 4:
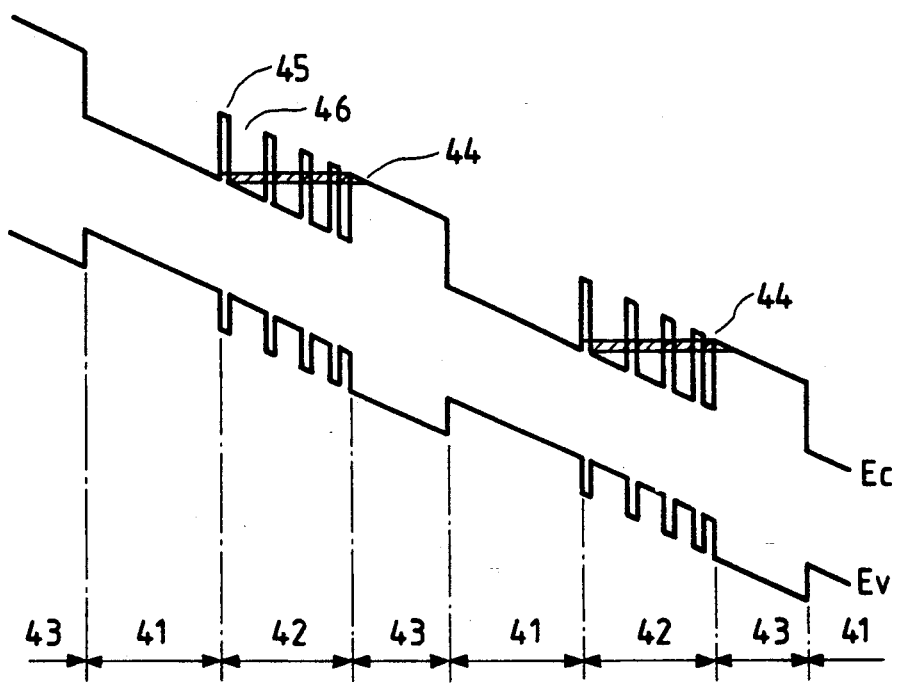
FIG. 4 is a band diagram of a superlattice multiplication layer in an APD according to one embodiment of this invention.

One embodiment of this invention will be explained with reference to FIGS. 3 and 4. FIG. 3 shows a structural view of a superlattice APD according to the present invention. Denoted by numerals 32 to 36 are a p-InAlAs buffer layer ($p=2\times 10^{18}$ cm$^{-3}$, film thickness $d=1.0$ μm), a p-InGaAs absorption layer ($p=5\times 10^{15}$ cm$^{-3}$, $d=1.2$ μm), a p-InAlAs field adjusting layer ($p=5\times 10^{16}$ cm$^{-3}$, $d=0.2$ μm), an undoped superlattice multiplication layer ($d=0.5$ μm, $n<1\times 10^{15}$ cm$^{-3}$), and an n-InAlAs buffer layer ($d=1.0$ μm, $n=2\times 10^{18}$ cm$^{-3}$), respectively. The junction diameter and the light reception diameter are 40 μm and 20 μm, respectively. The superlattice structure for miniband transfer according to this invention is disposed inside the superlattice multiplication layer 35, at the 33-34 interface and at the 34-35 interface. The details of the superlattice multiplication layer 35 are shown in FIG. 4. The superlattice multiplication layer has a periodic structure of ten combinations of an InGaAs well layer 41 ($d=200$ Å), an InAlAs barrier layer 43 ($d=100$ Å), and a superlattice structure 42 of the present invention ($d=200$ Å). The superlattice structure 42 comprises four combinations of InAlAs barrier layer 45 ($d=10$ Å) and InGaAs well layer 46, the well layers differing in film thickness.

The film thickness values of the InGaAs well layers 46 are 55, 45, 35 and 25 Å, in this order from the side of the well layer 41. This geometry has been designed so that a miniband 44 is formed when an electric field of about 300 kV/cm is applied to the superlattice multiplication layer 35.

The above element is fabricated by the following process. Crystal growth was carried out by an MBE method using a solid source. A growth temperature of 500° C. and an arsenic pressure of $1\times 10^{-5}$ Torr are used. A substrate of n-InP 37 ($n=2\times 10^{18}$ cm$^{-3}$, $d=400$ μm) is used, and the InGaAs and InAlAs grown are set in lattice match to the substrate with accuracy within 0.02%. Mesa-etching is carried out by wet etching based on a dichromic acid or dichromate system. For a p-electrode 31, Ti/Au formed by evaporation using an electron beam is used, whereas AuGeNi/Au formed by evaporation based on a resistance heating system is used for an n-electrode 38.

Now, the characteristics of the element will be shown. The breakdown voltage is 33 V, and the dark current is 40 nA at a multiplication factor of 1, and is 1 μA under an applied voltage (30 V) equal to 0.9 times the breakdown voltage. The quantum efficiency for an incident light wavelength of 1.55 μm is 60%. The ionization rate ratio determined by noise measurement is about 5 at a multiplication factor of 10. Analysis of high-frequency characteristics by a network analyzer gives a cut off frequency of 11 GHz, for 3 dB down at a multiplication factor of 10. The high-speed performance and high gain arise from the effect of the pile-up prevention layer (42 in FIG. 4) formed by use of the superlattice according to the invention. To confirm this effect, an element devoid of the pile-up prevention layer 42 in FIG. 4 was prepared, and the high-frequency characteristics thereof were compared with those of the above element according to the invention. The comparative element gives a maximum cut off frequency of only up to 1.5 GHz, with the multiplication factor at that point being 4. These results show that the introduction of the superlattice structure of the present invention is extremely effective for enhancing the high-speed performance of APD.

Figure 5:
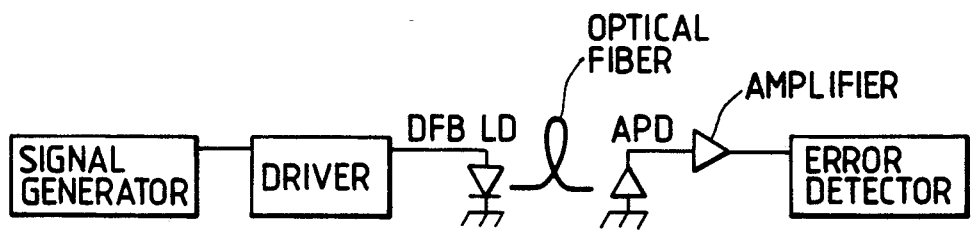
FIG. 5 is a diagram illustrating an optical transmission system according to one embodiment of this invention.

Also, with the element according to this invention, a simple transmission experiment is carried out using a transmission system as shown in FIG. 5. A random signal with a bandwidth of 10 Gb/s generated by a signal generator is used to drive a DFB-LD through a driver. An optical signal thus generated is transmitted through a 100 km long optical fiber, to be received by the APD according to the invention. An electrical signal obtained through conversion by the APD is amplified by an amplifier, and minimum receiver-sensitivity at various error rates is determined by use of an error detector. In the 10 Gb/s transmission experiment carried out using the DFB laser with an oscillation wavelength of 1.55 μm, a minimum receiver-sensitivity of $-30$ dBm is obtained at a bit error rate of $10^{-9}$.

EXAMPLE 2

Figure 6:
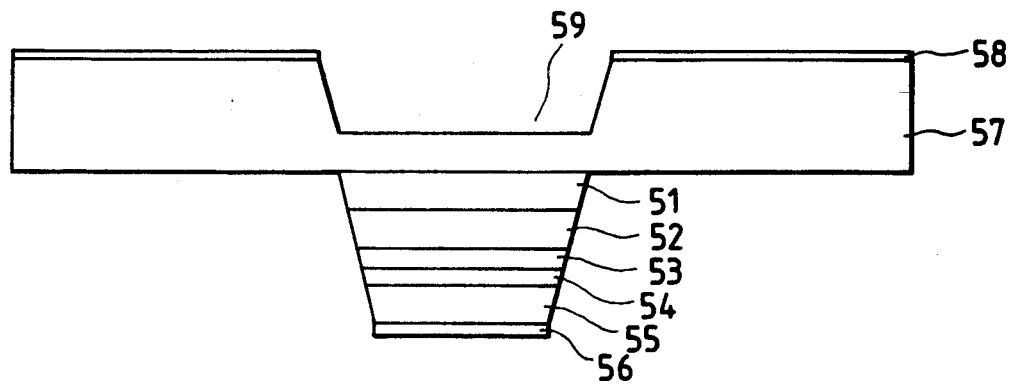

Another embodiment of an InGaAs/InAlAs superlattice APD will be explained with reference to FIG. 5. FIG. 6 shows a sectional view of the element according to this embodiment. The element is a back-illumination type element mounted facedown. Denoted by numerals 51 to 55 are a p-InAlAs buffer layer, a p-InGaAs absorption layer, a p-InAlAs field adjusting layer, an undoped superlattice multiplication layer, and an n-InAlAs buffer layer, respectively, which correspond respectively to the layers 32 to 36 in Example 1. The values of film thickness and carrier concentration of the layers 51 to 55 are the same as those of the layers 32 to 36. The structure of the superlattice multiplication layer is also the same as in Example 1 shown in FIG. 4, and comprises a pile-up prevention layer 42 using the superlattice according to the invention. In FIG. 6, numeral 57 denotes a p-InP ($p=5\times 10^{18}$ cm$^{-3}$, $d=400$ μm), 56 and 58 denote an n-electrode and a p-electrode, respectively, and 59 denotes a light incidence portion formed by boring a 350-μm deep hole in a substrate. The junction diameter of the element is 20 μm.

The fabrication process of this element is fundamentally the same as in Example 1.

The main characteristics of the element are: a breakdown voltage of 35 V, a dark current of 80 nA at a multiplication factor of 1, a quantum efficiency of 55% ($\lambda=1.55$ μm). The 3-dB cut off frequency is 12 GHz (multiplication factor 10).

Although the invention has been described above with reference to its application to an InGaAs/InAlAs superlattice APD, the invention is applicable to InP/InGaAs APDs and GaSb/GaAlSb APDs, also.

EXAMPLE 3

An application of the miniband transfer of the present invention to a semiconductor element other than the superlattice APD will now be explained below.

Figure 7:
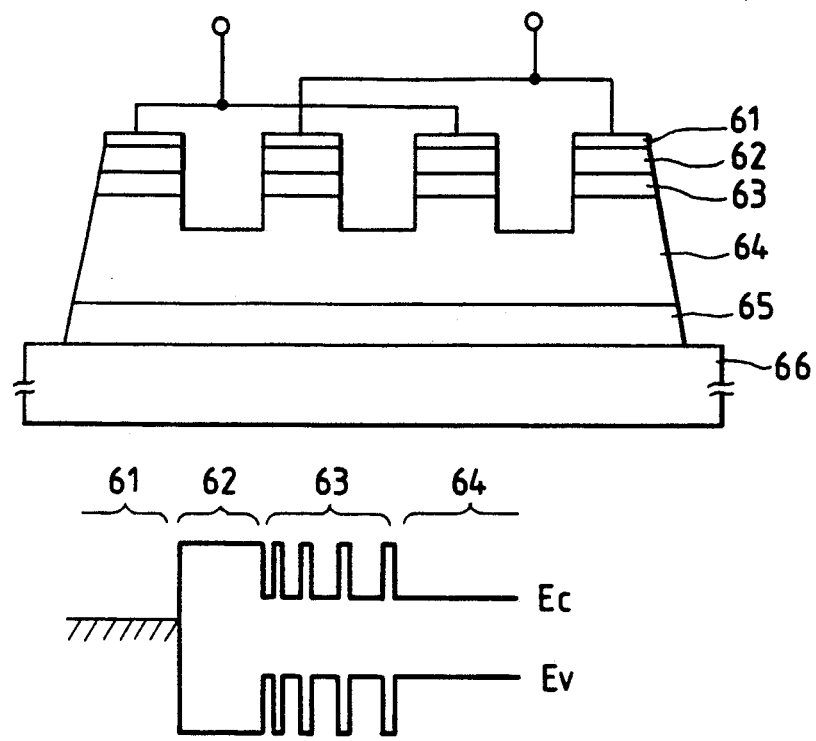
FIG. 7 is a sectional view of an MSM photodiode according to one embodiment of this invention.

In FIG. 7, there is shown an MSM photodiode using the miniband transfer. An InAlAs buffer layer (film thickness $=0.2$ μm), an InGaAs absorption layer (1.5 μm) 64, an InGaAs/InAlAs miniband transfer layer 63 and an InAlAs Schottky formation layer 62 (0.07 μm) are provided on a semi-insulating InP substrate 66, and two pairs of Schottky electrodes 61 are provided oppositely.

In a lower portion of FIG. 7 is shown a band diagram for a portion of the MSM photodiode in the vicinity of a miniband transfer portion. Photo-carriers generated in the absorption layer 64 are transferred at high speed through the miniband in the miniband transfer layer 63 to the external electrode 61. The miniband transfer layer 63 comprises 10-Å thick InAlAs barriers and 10-, 20-, 30- and 40-Å thick InGaAs wells. The width of the electrode portion (Al) is 1 μm, and the electrode spacing is 1.5 μm.

The fabrication process of this element is basically the same as in Example 1.

The element gives a sensitivity of 1 A/W (incident light wavelength of 1.5 μm), an impulse response rise time of 8 ps and a fall time of 9 ps.

EXAMPLE 4

Figure 8:
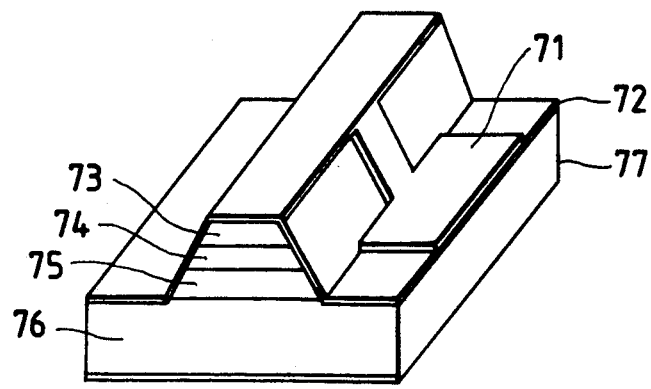
FIG. 8 is a sectional view of an optical modulator according to one embodiment of this invention.

FIG. 8 shows an embodiment of an optical modulator using the miniband transfer of the present invention. This modulator is an absorption type optical modulator employing the quantum-confinement Stark effect produced when a reverse bias is applied to a multiple quantum well layer 74. An n-InAlAs clad layer 75, an undoped multiple quantum well optical waveguide layer 74 and a p-InAlAs clad layer 73 are provided on an n+-InP 76, and an n-electrode 77 and a p-electrode 71 are provided at lower and upper portions. Denoted by 72 is an SiN film serving as an insulating film for the p-electrode and serving also for passivation of side surface portions of a ridge portion. The width of the waveguide in the ridge portion is 5 μm, and the element length is 200 μm. The optical waveguide 74 comprises a miniband structure of the invention therein, with the fundamental construction being the same as in FIG. 4, except that the well width was adjusted to 50 Å in accordance with an operation wavelength of 1.5 μm.

The fabrication process of this element is substantially the same as in Example 1.

This modulator shows an extinction ratio of 20 dB and a bandwidth of 10 GHz.

The above examples have been described with principal reference to the elements in which the film thickness of the barrier layer for forming the miniband is 10 Å. As has also been described above, however, the invention is not limited to the thickness value.

Although the invention has been mainly described with reference to a photodiodes, it is to be appreciated that other optical devices are applicable, including optical modulators, imaging devices, and the like.

The invention has been described with reference to preferred embodiments. Obviously, modification and alteration will occur to those of ordinary skill in the art upon reading and understanding the present specification. It is intended that the present invention be construed as including all such alterations and modifications in so far as they come within the scope of the appended claims or the equivalent thereof.

We claim:

1. A semiconductor device including:
a first semiconductor layer;
a second semiconductor layer disposed on the first semiconductor layer, said second semiconductor layer having a first superlattice structure comprising first semiconductor regions having a first energy bandgap and second semiconductor regions having a second energy bandgap greater than the first energy bandgap, the first semiconductor regions and the second semiconductor regions being alternately disposed; and
a third semiconductor layer disposed on the second semiconductor layer,
wherein the second semiconductor layer further comprises second superlattice structures each disposed between the first and second semiconductor regions, each of the second superlattice structures comprising third semiconductor regions having a third energy bandgap and fourth semiconductor regions having a fourth energy bandgap greater than the third energy bandgap, the third semiconductor regions and the fourth semiconductor regions being alternately disposed so that each of the second superlattice structures forms a miniband.

2. A semiconductor device including:
a first semiconductor layer;
a second semiconductor layer disposed on the first semiconductor layer, said second semiconductor layer having a first superlattice structure comprising first semiconductor regions having a first energy bandgap and second semiconductor regions having a second energy bandgap greater than the first energy bandgap, the first semiconductor regions and the second semiconductor regions being alternately disposed; and
a third semiconductor layer disposed on the second semiconductor layer,
wherein the second semiconductor layer further comprises second superlattice structures each disposed between the first and second semiconductor regions, each of the second superlattice structures comprising third semiconductor regions having a third energy bandgap and fourth semiconductor regions having a fourth energy bandgap greater than the third energy bandgap, the third semiconductor regions and the fourth semiconductor regions being alternately disposed so that each of the second superlattice structures forms a miniband; and
wherein the first energy bandgap is equal to the third energy bandgap and the second energy bandgap is equal to the fourth energy bandgap.

3. A semiconductor device including:
a first semiconductor layer;
a second semiconductor layer disposed on the first semiconductor layer, said second semiconductor layer having a first superlattice structure comprising first semiconductor regions having a first energy bandgap and second semiconductor regions having a second energy bandgap greater than the first energy bandgap, the first semiconductor regions and the second semiconductor regions being alternately disposed; and
a third semiconductor layer disposed on the second semiconductor layer,
wherein the second semiconductor layer further comprises second superlattice structures each disposed between the first and second semiconductor regions, each of the second superlattice structures comprising third semiconductor regions having a third energy bandgap and fourth semiconductor regions having a fourth energy bandgap greater than the third energy bandgap, the third semiconductor regions and the fourth semiconductor regions being alternately disposed so that each of the second superlattice structures forms a miniband; and wherein the first semiconductor layer comprises a layer of InAlAs, each of the first and third semiconductor regions comprises a layer of InGaAs, each of the second and fourth semiconductor regions comprises a layer of InAlAs and the third semiconductor layer comprises a layer of InAlAs.

4. A photodiode including:

a buffer layer;

a superlattice multiplication layer disposed on the buffer layer, comprising first well layers and first barrier layers which are alternately disposed; and an absorption layer disposed on the superlattice multiplication layer, wherein the superlattice multiplication layer further comprises superlattice structures disposed between the first well layers and the first barrier layers, respectively, each of the superlattice structures comprising second barrier layers and second well layers which are alternately disposed so that each of the superlattice structures forms a miniband, thickness of the second well layers in each superlattice structure decreasing toward the buffer layer.

5. The photodiode according to claim 4, further including a field adjusting layer disposed between the superlattice multiplication layer and the absorption layer.

6. The photodiode according to claim 4, wherein the second barrier layers have the same material as that of the first barrier layers and the second well layers have the same material as that of the first well layers.

7. The photodiode according to claim 4, wherein the buffer layer comprises a layer of InAlAs, each of the first and second well layers comprises a layer of InGaAs, each of the first and second barrier layers comprises a layer of InAlAs and the absorption layer comprises a layer of InGaAs.

8. An optical modulator including:

a first cladding layer;

a multiple quantum well optical waveguide layer disposed on the first cladding layer, comprising first well layers and first barrier layers which are alternately disposed; and a second cladding layer disposed on the multiple quantum well optical waveguide layer, wherein the multiple quantum well optical waveguide layer further comprises superlattice structures disposed between the first well layers and the first barrier layers, respectively, each of the superlattice structures comprising second barrier layers and second well layers which are alternately disposed so that each of the superlattice structures forms a miniband, thickness of the second well layers decreasing gradually in each superlattice structure toward the first cladding layer.

9. The optical modulator according to claim 8, wherein the second barrier layers have the same material as that of the first barrier layers and the second well layers have the same material as that of the first well layers.

10. The optical modulator according to claim 8, wherein each of the first and second well layers comprises a layer of InGaAs and each of the first and second barrier layers comprises a layer of InAlAs.

11. The photodiode according to claim 5, wherein the second barrier layers have the same material as that of the first barrier layers and the second well layers have the same material as that of the first well layers.

12. The photodiode according to claim 5, wherein the buffer layer comprises a layer of InAlAs, each of the first and second well layers comprises a layer of InGaAs, each of the first and second barrier layers comprises a layer of InAlAs and the absorption layer comprises a layer of InGaAs.

* * * * *